(12) United States Patent  
Shiina

(10) Patent No.: US 6,730,985 B2  
(45) Date of Patent: May 4, 2004

(54) SEMICONDUCTOR INTEGRATED CIRCUIT DEVICE

(75) Inventor: Masahiro Shiina, Ora-Gun (JP)

(73) Assignee: Sanyo Electric Co., Ltd., Osaka (JP)

(\*) Notice: Subject to any disclaimer, the term of this patent is extended or adjusted under 35 U.S.C. 154(b) by 0 days.

(21) Appl. No.: 10/400,926

(22) Filed: Mar. 28, 2003

(65) Prior Publication Data

US 2003/0222274 A1 Dec. 4, 2003

(30) Foreign Application Priority Data

Mar. 29, 2002 (JP) ........................................ 2002-094752
Apr. 23, 2002 (JP) ........................................ 2002-120631

(51) Int. Cl.[7] ............................................. H01L 29/00
(52) U.S. Cl. .................... 257/546; 257/173; 257/355; 257/773; 257/784
(58) Field of Search .......................... 257/173, 355, 257/546, 734, 773, 784

(56) References Cited

U.S. PATENT DOCUMENTS

| | | | | |
|---|---|---|---|---|
| 4,839,768 A | * | 6/1989 | Daniele et al. ............. | 257/546 |
| 5,223,737 A | * | 6/1993 | Canclini ..................... | 257/546 |
| 5,293,057 A | * | 3/1994 | Ho et al. .................... | 257/356 |
| 5,473,169 A | * | 12/1995 | Ker et al. ................... | 257/173 |
| 5,696,404 A | * | 12/1997 | Murari et al. .............. | 257/620 |
| 6,303,445 B1 | * | 10/2001 | Ma ............................ | 438/294 |

FOREIGN PATENT DOCUMENTS

JP          2001-127249          11/2001

\* cited by examiner

*Primary Examiner*—T. N. Quach  
(74) *Attorney, Agent, or Firm*—Morrison & Foerster, LLP

(57) ABSTRACT

Unnecessary crossing of interconnections are eliminated to reduce the impedance of wiring of an LSI of a semiconductor integrated circuit device. In the semiconductor integrated circuit device of multi layer structure having a circuit block, a pad electrically connected with the circuit block and a protection circuit electrically connected with the pad, a plurality of cells each including the pad and the protection circuit disposed adjacent to each other are disposed along a periphery of the circuit block. Impedance of the wiring in the LSI is reduced by disposing a top metal layer providing a power supply voltage Vcc along outer sides of the cells and by making the width of a bottom metal layer providing a ground voltage, or a reference voltage, as wide as possible.

7 Claims, 12 Drawing Sheets

SEMICONDUCTOR INTEGRATED CIRCUIT DEVICE

BACKGROUND OF THE INVENTION

1. Field of the Invention

This invention relates to a protection circuit of a semiconductor integrated circuit device, specifically to a protection circuit with reduced wiring.

2. Description of the Related Art

A semiconductor integrated circuit device has a possibility of breakdown when an excessive external voltage is applied to its input pin. Various kinds of input protection circuits are incorporated in semiconductor integrated circuit devices to prevent this breakdown.

For example, a poly silicon gate MOS integrated circuit is provided with a protection circuit 80 as shown in FIG. 11. The protection circuit 80 includes two diodes D3 and D4 connected in series. A cathode of the protection diode D3 is connected to Vcc (power supply voltage), while an anode of the protection diode D4 is connected to GND (ground voltage or reference voltage). An input terminal 81 is connected to a connecting node 83 between the two protection diodes D3 and D4 and further connected to an internal circuit through a terminal 82.

An excessive external voltage due to an electrostatic discharge, or the like, is applied to the input terminal 81 of the protection circuit 80. When a voltage higher than Vcc is applied, the protection diode D3 conducts to clamp the voltage at the connecting node 83, and keeps the internal circuit beyond the terminal 82 from the high voltage. Similarly, when a negative high voltage lower than GND is applied, the protection diode D4 conducts to clamp the voltage at the connecting node 83, and keeps the internal circuit beyond the terminal 82 from the negative high voltage.

FIG. 12 is a plan view of a conventional semiconductor integrated circuit device, that is, an LSI 100 with the protection circuit 80. The LSI 100 includes three circuit blocks 101A–101C, 16 pads 102A–102P and 16 protection circuits 104A–104P. The circuit block denotes a circuit containing many elements such as resistances, transistors and capacitors.

Each of the pads 102A–102P is connected with each of the circuit blocks 101A–101C through an interconnection 103. Each of the protection circuits 104A–104P is connected with each of the pads 102A–102P through an interconnection 105, respectively.

Each of the protection circuits 104A–104P contains the protection circuit 80 shown in FIG. 11 and requires two interconnections (not shown) to electrically connect with a Vcc wiring and a GND wiring formed in the LSI 100. An area each of the protection circuits 104A–104P takes up is about ⅓ to ½ of that of each of the pads 102A–102P.

In the layout design of the semiconductor integrated circuit device shown in FIG. 12, placement of the elements is usually determined through the following procedures.

First, three circuit blocks 101A–101C are disposed around a center of the LSI 100. Positional relationship among positions of the three circuit blocks is determined considering die size and functionality. In FIG. 12, the circuit blocks 101A and 101B having the same area are placed parallel to the largest circuit block 101C.

Second, the pads 102A–102P are disposed at regular intervals around the three circuit blocks 101A–101C.

Third, the protection circuits 104A–104P are disposed in the LSI 100. Since each of the protection circuits 104A–104P takes up a small area than each of the pads 102A–102P, each of the protection circuits 104A–104P is placed in an empty space, or so-called a dead space, between the circuit blocks 101A–101C and the pads 102A–102P.

Then, interconnections 103, 105 are disposed. In addition, the Vcc wiring and the GND wiring for the protection circuits 104A–104P are disposed.

However, there are the following disadvantages when the elements of the conventional semiconductor integrated circuit device shown in FIG. 12 are disposed.

First, there are crossings between the interconnections 103 and the interconnections 105, since the protection circuits 104A–104P are disposed utilizing the so-called dead space in the LSI 100. Looking at the pad 102A and the protection circuit 104A in the lower right corner of the LSI 100 in FIG. 12, for example, the interconnection 103 and the interconnection 105 intersect each other.

The crossing of the interconnection 103 and the interconnection 105 may cause a trouble such as a short circuit an interference in signal lines. In addition, the interconnections 103 and 105 and the Vcc and GND wiring, with which the protection circuits 104A–104P are connected, are intertwined with each other complicatedly. This may cause an unexpected adverse effects in a designed layout, requiring a thicker interlayer isolation film or more via holes.

Second, in the semiconductor integrated circuit device of recent years which has multi layer structure and thus requires complicated manufacturing processes, larger number of interconnections increases the impedance of the interconnections, resulting in deterioration in characteristics of the LSI 100.

SUMMARY OF THE INVENTION

The invention provides a semiconductor integrated circuit device that includes a circuit block, a pad electrically connected to the circuit block and a protection circuit integrated with the pad as an integrated device element. An internal electrical connection is provided within the integrated device element between the pad and the protection circuit.

DETAILED DESCRIPTION OF THE INVENTION

The first embodiment of this invention will be explained referring to FIG. 1–FIG. 5, and then the second embodiment of this invention will be explained referring to FIG. 6–FIG. 10.

Figure 1:
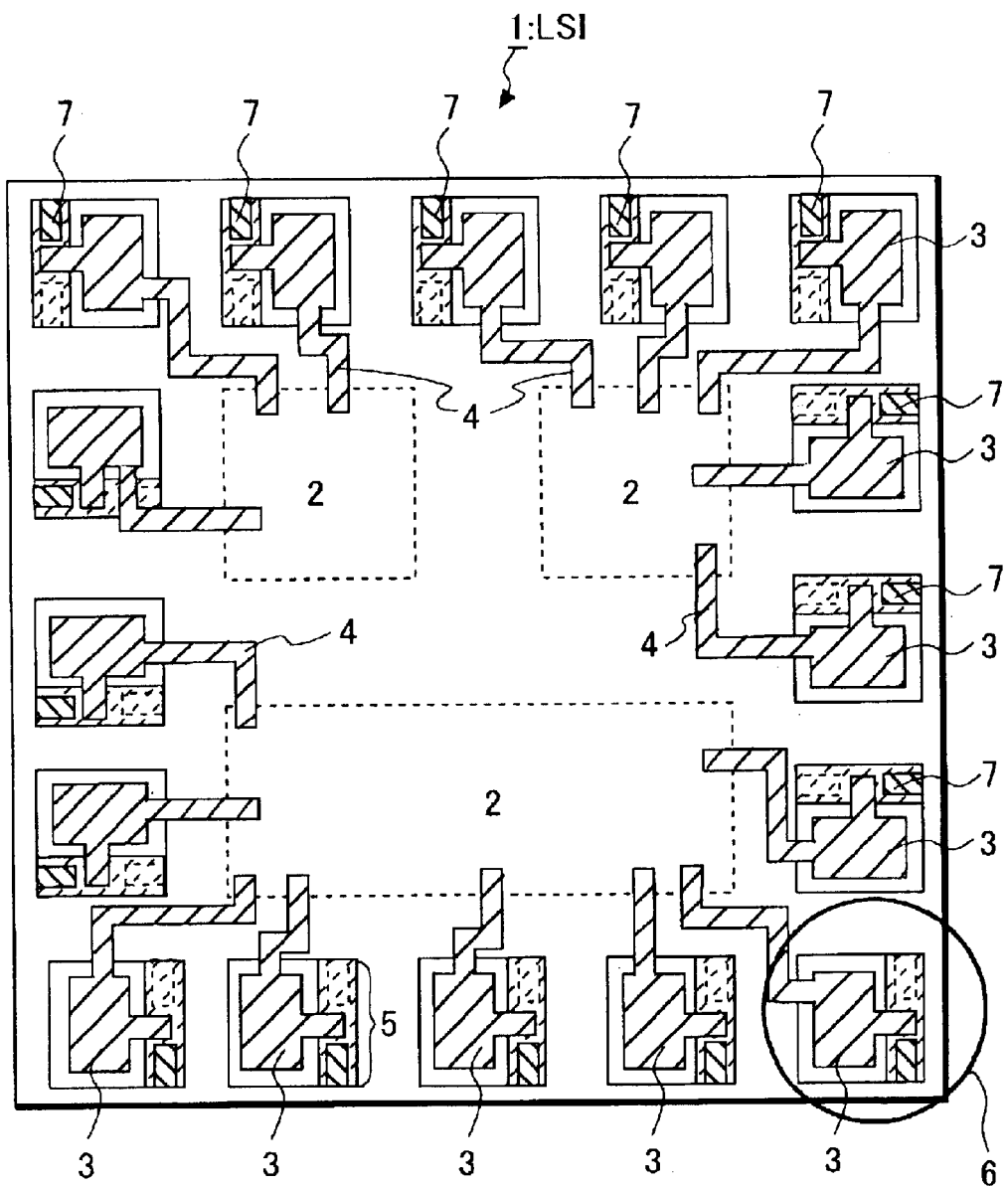
FIG. 1 is a plan view of a semiconductor integrated circuit device of the first embodiment of the invention.

FIG. 1 is a plan view of an integrated circuit die (hereafter referred to as LSI) 1 according to the first embodiment of this invention. Pads 3 are formed around circuit blocks 2, and the circuit blocks 2 and the pads 3 are electrically connected through interconnections 4. The circuit block 2 denotes a circuit containing many elements such as resistances, transistors and capacitors.

The interconnection 4 is a metal interconnection connecting the circuit block 2 and the pad 3. A protection circuit 5 disposed adjacent the pad 3 consists of two diodes connected in series and provides a protection function against an excessive external voltage by shunting current to Vcc wiring or GND wiring to clamp input voltage.

A top layer metal 7 is a metal interconnection formed on a top surface of one of the two diodes in the protection circuit 5.

The LSI 1 includes three circuit blocks 2 disposed around its center and 16 pads 3 disposed in its periphery. Nevertheless, the number of the circuit blocks 2 and the number of the pads 3 may vary depending on a specific device requirement.

Figure 2:
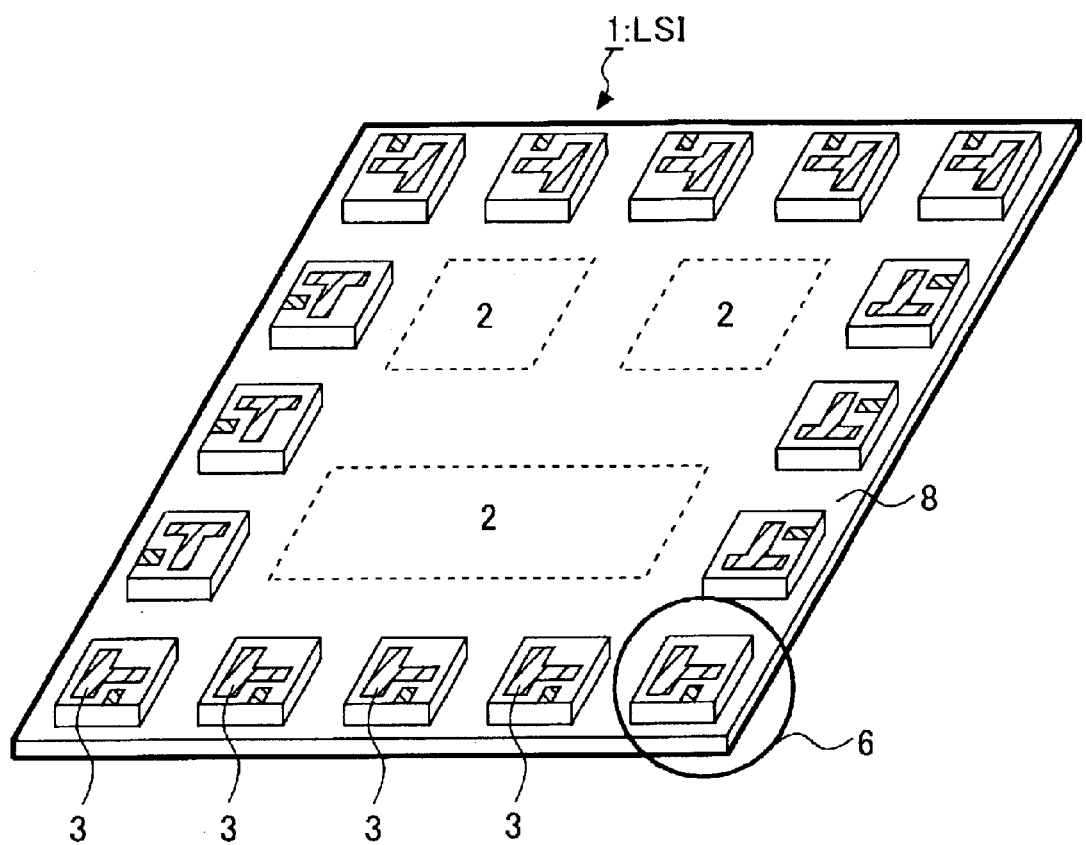
FIG. 2 is an oblique perspective view of the device of FIG. 1.

Each of the protection circuits 5 is disposed adjacent each of the pads 3 to form an integrated structure (hereafter referred to as a cell) 6. The cell 6 is shown in a circle in FIG. 1. FIG. 2 is a bird's eye view of the LSI 1 looked from above obliquely. The interconnections 4 shown in FIG. 1 are omitted for the sake of simplicity.

An interlayer insulation film 8 is formed on the LSI 1. Each of the cells 6 includes the pad 3 and the protection circuit 5 as one integrated element, and the cells 6 are aligned along each side of the LSI 1 with a predetermined pattern.

Figure 3:
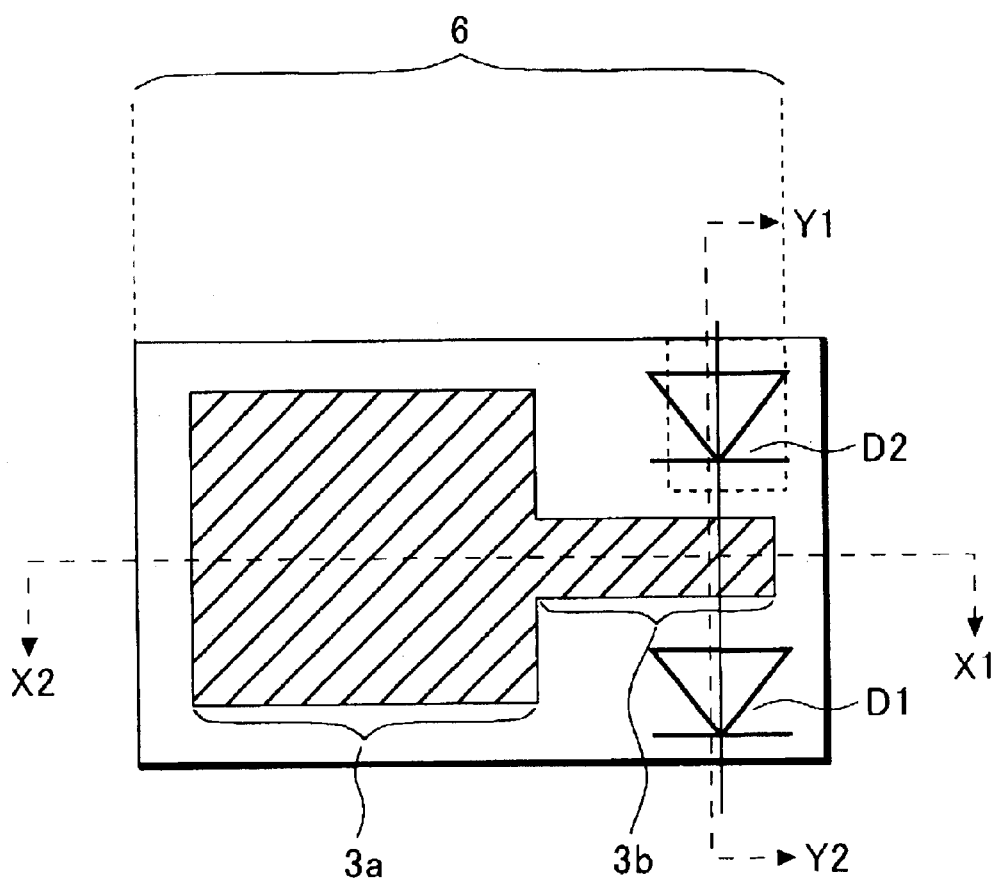
FIG. 3 is an expanded plan view of a cell of the device of FIG. 1.

FIG. 3 is an enlarged plan view of the cell 6. The cell 6 includes the pad 3 and the protection circuit 5. The pad 3 consists of a larger rectangular bonding pad 3a and a smaller rectangular extension 3b formed continuously.

The bonding pad 3a is formed to be electrically connected with the circuit block 2 as shown in FIG. 1. The extension 3b is formed as an extension to the bonding pad 3a, and directly connected with the protection circuit 5 formed underneath. The protection circuit 5 includes two diodes D1 and D2 connected in series.

Figure 4:
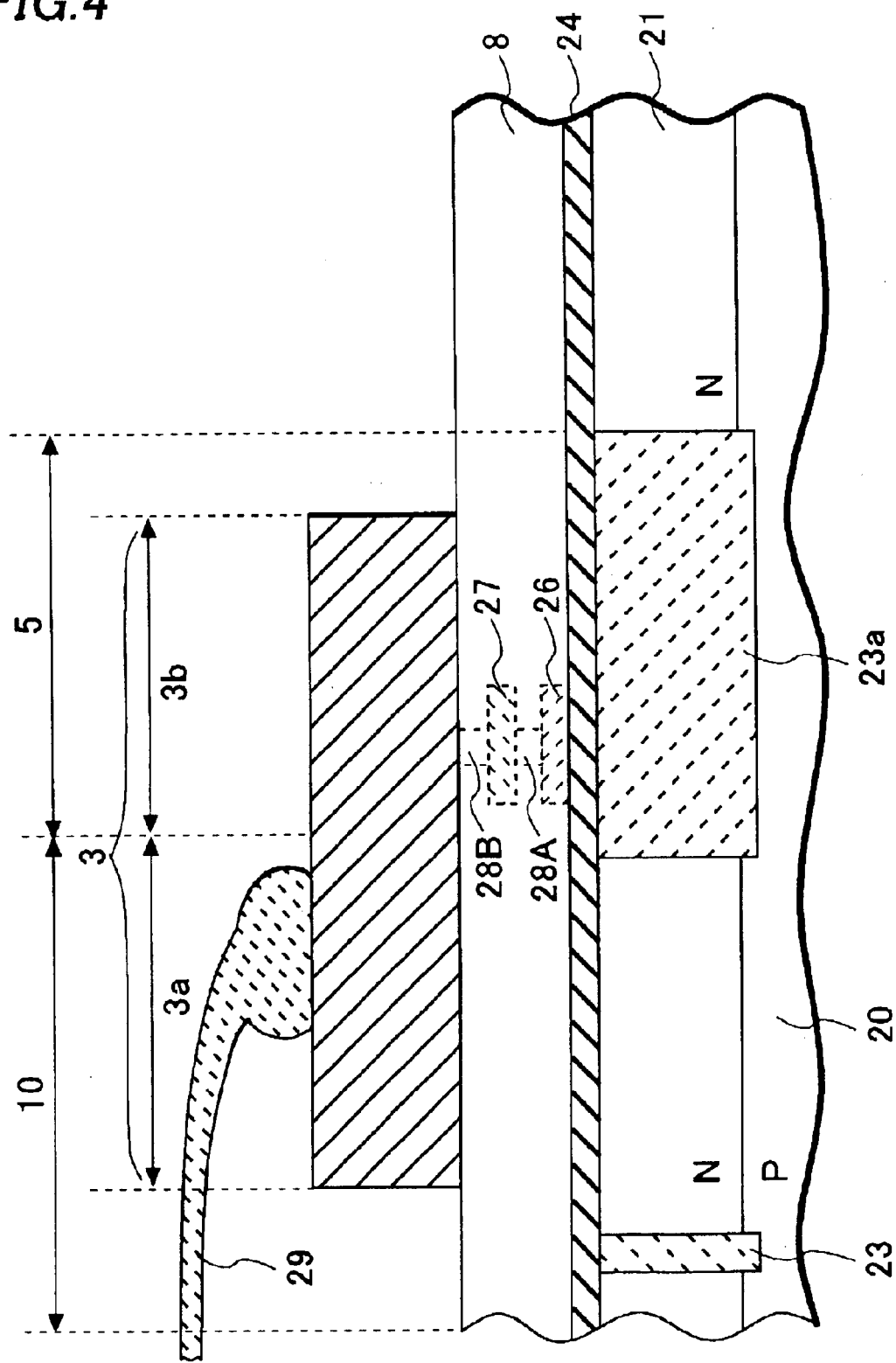
FIG. 4 is an expanded cross-sectional view of the cell of FIG. 3.
Figure 5:
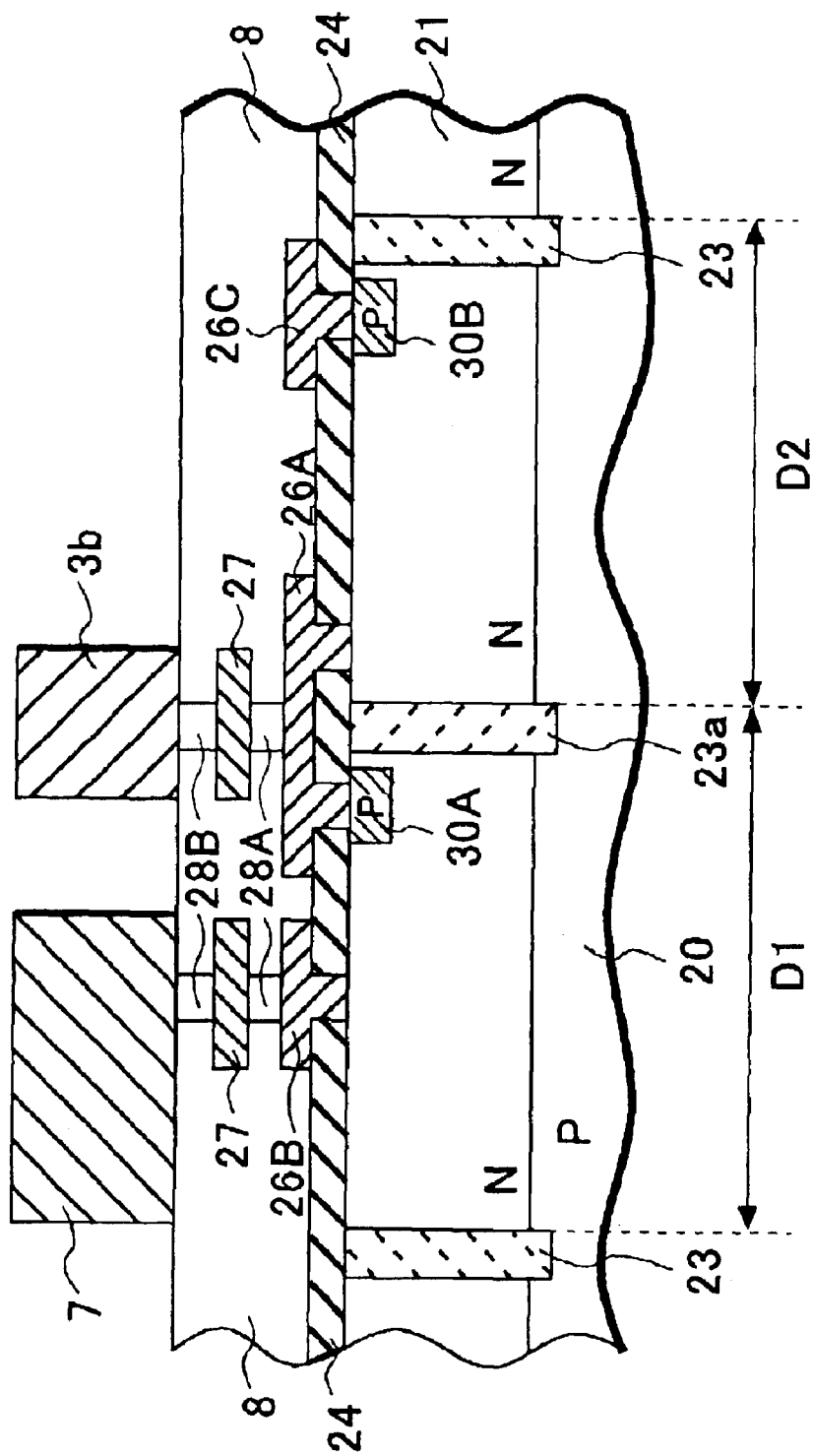
FIG. 5 is another expanded cross-sectional view of the cell of FIG. 3.

Cross-sectional view of the cell 6 is explained referring to FIG. 4 and FIG. 5 hereinafter. FIG. 4 is an expanded cross-sectional view of a section X1-X2 shown in FIG. 3, and FIG. 5 is an expanded cross-sectional view of a section Y1-Y2 shown in FIG. 3.

FIG. 4 is explained hereinafter. An N-type semiconductor layer 21 is formed on a P-type semiconductor substrate 20. The semiconductor layer 21 is electrically separated with isolation layers 23 and 23a. The isolation layer 23a separates the two diodes D1 and D2 in the protection circuit 5 from each other. That is, the diode D1 is located in front of the isolation layer 23a while the diode D2 is located behind the isolation layer 23a. An oxide film 24 is a silicon dioxide film formed on the surface of the semiconductor layer 21 by thermal oxidation.

An interlayer insulation film 8 is formed on the oxide film 24. A plurality of metal layers (for example, a bottom layer metal 26 and an intermediate layer metal 27 in the figure) and a plurality of contact holes, for example 28A and 28B, electrically connecting the metal layers are formed in the interlayer insulation film 8.

Next, each of the metal layers and others in the interlayer insulation film 8 is explained. The bottom layer metal 26 is formed at a desired position on the surface of the oxide film 24 and makes contact with the connection node between the diodes D1 and D2 in the protection circuit 5. The bottom layer metal 26 is connected with the pad 3 through the contact hole 28A, the intermediate layer metal 27 and the contact hole 28B. There are two metal layers (the bottom layer metal 26 and the intermediate layer metal 27) in this embodiment. However, the device of this embodiment may have a single metal layer or more than two metal layers.

The pad 3 is formed on a desired position on the surface of the interlayer insulation film 8. A bonding wire 29 is formed on the bonding pad 3a. A region below the bonding pad 3a may be used to accommodate a structure such as a deep trench.

FIG. 5 is explained hereinafter. The semiconductor layer 21 formed on the semiconductor substrate 20 is electrically divided with the plurality of isolation layers 23 and 23a. The isolation layer 23a separates the diode D1 and the diode D2. The oxide film 24 covers the surface of the semiconductor layer 21.

The diodes D1 and D2 have P-type layers 30A and 30B formed by diffusion from the surface of the semiconductor layer 21. The P-type layer 30A makes an anode of the diode D1 and the P-type layer 30B makes an anode of the diode D2.

The bottom layer metals 26A, 26B and 26C are formed on the oxide film 24 by patterning the bottom layer metal 26, and make contact with the N-type semiconductor layer 21 and the P-type layers 30A and 30B.

The bottom layer metal 26A is formed below the extension 3b to electrically connect the P-type layer 30A of the diode D1 and the N-type layer 21 of the diode D2. The bottom layer metal 26A is connected through the contact hole 28A with the intermediate layer metal 27 which is connected through the contact hole 28B with the extension 3b formed on the interlayer insulation film 8.

The N-type layer of the diode D1 is connected with the bottom layer metal 26B which is connected with the top layer metal 7 through the contact hole 28a, the intermediate layer metal 27 and the contact hole 28B. And the P-type layer 30B of the diode D2 formed in the N-type semiconductor layer 21 is connected with the bottom layer metal 26C. The bottom layer metal 26B is provided with the power supply voltage Vcc through the top layer metal 7, and the bottom layer metal 26C is provided with the ground voltage GND. The GND wiring and the Vcc wiring, which provide the diodes D1 and D2 of the protection circuits with the ground voltage GND and the power supply voltage Vcc, respectively, are connected to each of the circuit blocks 2 corresponding to each of the protection circuits 5.

Although the extension 3b and the top layer metal 7 have the same film thickness in the embodiment disclosed, they may have different film thickness.

As described above, the semiconductor integrated circuit device shown in FIG. 1 and FIG. 2 is formed by disposing cells 6 having the cross-sectional structure shown in FIG. 4 and FIG. 5.

The first embodiment of this invention has following effects. Interconnections between the pads 3 and the protection circuits 5 are no longer needed, since each of the pads 3 and each of the protection circuits 5 are integrated in the cell 6. With this, each of the cells 6 is connected to each of the circuit blocks 2 with a single interconnection 4, eliminating unnecessary crossing structures of the interconnections, and reducing occurrence of troubles such as a short circuit. And it is possible to omit process steps to form metal wiring, which are necessary to provide the protection circuits with the power supply voltage Vcc and the ground voltage GND in the conventional art.

Once the cell 6 which integrates the pad 3 and the protection circuit 5 is designed, it can be copied and used repeatedly in the layout design. On the contrary, the conventional art requires time and effort to place each of the protection circuits 104A–104P in the dead space in the LSI 100. With the integrated cell 6 of this embodiment, time and effort in the layout design can be saved to improve working efficiency. Thus the time to complete the layout design can be reduced.

Furthermore, a use of a signal with high performance is possible, since crossing of the interconnection for the protection circuit and the interconnection for the signal is eliminated.

Figure 6:
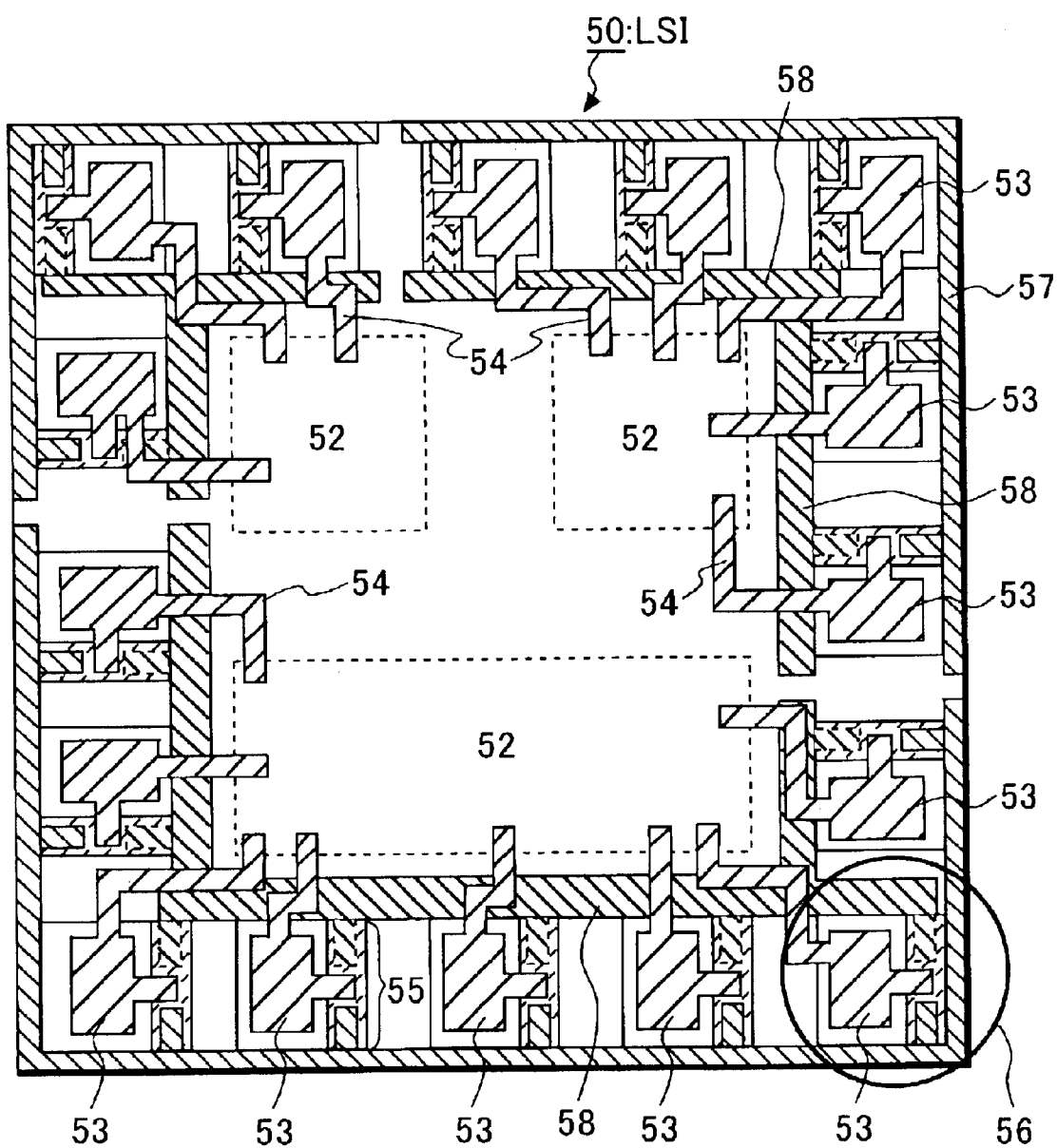
FIG. 6 is a plan view of a semiconductor integrated circuit device of the second embodiment of the invention.

Next, the second embodiment of this invention is explained. FIG. 6 is a plan view of an integrated circuit (hereafter referred to as LSI) 50 according to the second embodiment of this invention.

Pads 53 are formed around circuit blocks 52, and the circuit blocks 52 and the pads 53 are electrically connected through interconnections 54. The circuit block 52 denotes a circuit containing many elements such as resistances, transistors and capacitors.

The interconnection 54 is a metal interconnection connecting the circuit block 52 and the pad 53. A protection circuit 55 is disposed adjacent the pad 53 and consists of two diodes connected in series.

The LSI 50 includes three circuit blocks 52 disposed around its center and 16 pads 53 disposed in its periphery in this embodiment, although theses number may vary depending on a specific device requirement. Each of the protection circuits 55 is disposed adjacent each of the pads 53 to form a cell 56.

The semiconductor integrated circuit shown in FIG. 6 has a multi layer structure and includes a plurality of metal wiring. A top layer metal 57 and a bottom layer metal 58 are formed along outer sides and inner sides of the cells 56.

Figure 7:
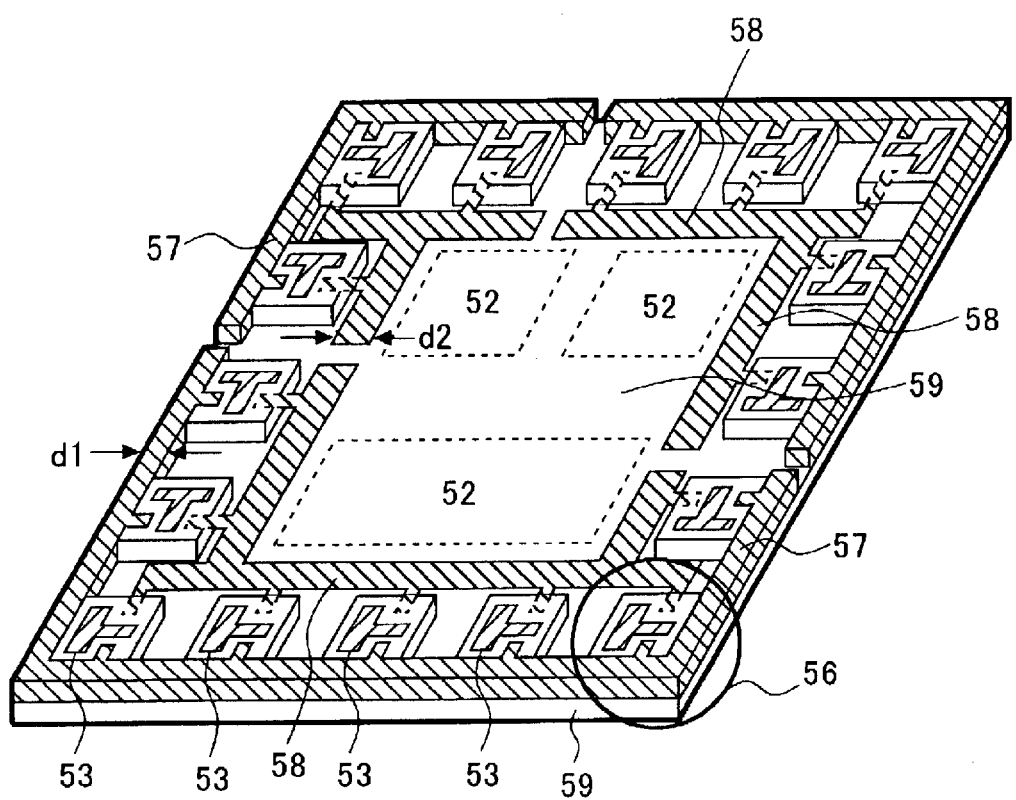
FIG. 7 is an oblique perspective view of the device of FIG. 6.

FIG. 7 is a bird's eye view of the LSI 50 looked from above obliquely. An interlayer insulation film 59 is formed on the LSI 50. Each of the cells 56 is an integrated structure of a pad 53 and a protection circuit 55 aligned along each side of the LSI 50 with a predetermined pattern.

The top layer metal 57 is formed by sputtering aluminum and extends along the outer sides of a plurality of the cells 56 keeping a width d1 and connecting with the diodes D1 on the outer sides of the protection circuits 55.

Forming the top layer metal 57 along the outer sides of the cells 56 as described increases the width of the top layer metal 57 and reduces the impedance of the Vcc wiring made of the top layer metal 57.

The bottom layer metal 58 is formed by sputtering aluminum and extends along the inner sides of the cells 56 between the cells 56 and the circuit blocks 52 keeping a width d2 wide and connecting with the diodes D2 on the inner sides of the protection circuits 55.

Forming the bottom layer metal 58 wide and along the inner sides of the cells 56 as described above reduces the impedance of the GND wiring made of the bottom layer metal 58. The widths d1, d2 are preferably as wide as possible to reduce the impedance of the Vcc wiring and the GND wiring.

Figure 8:
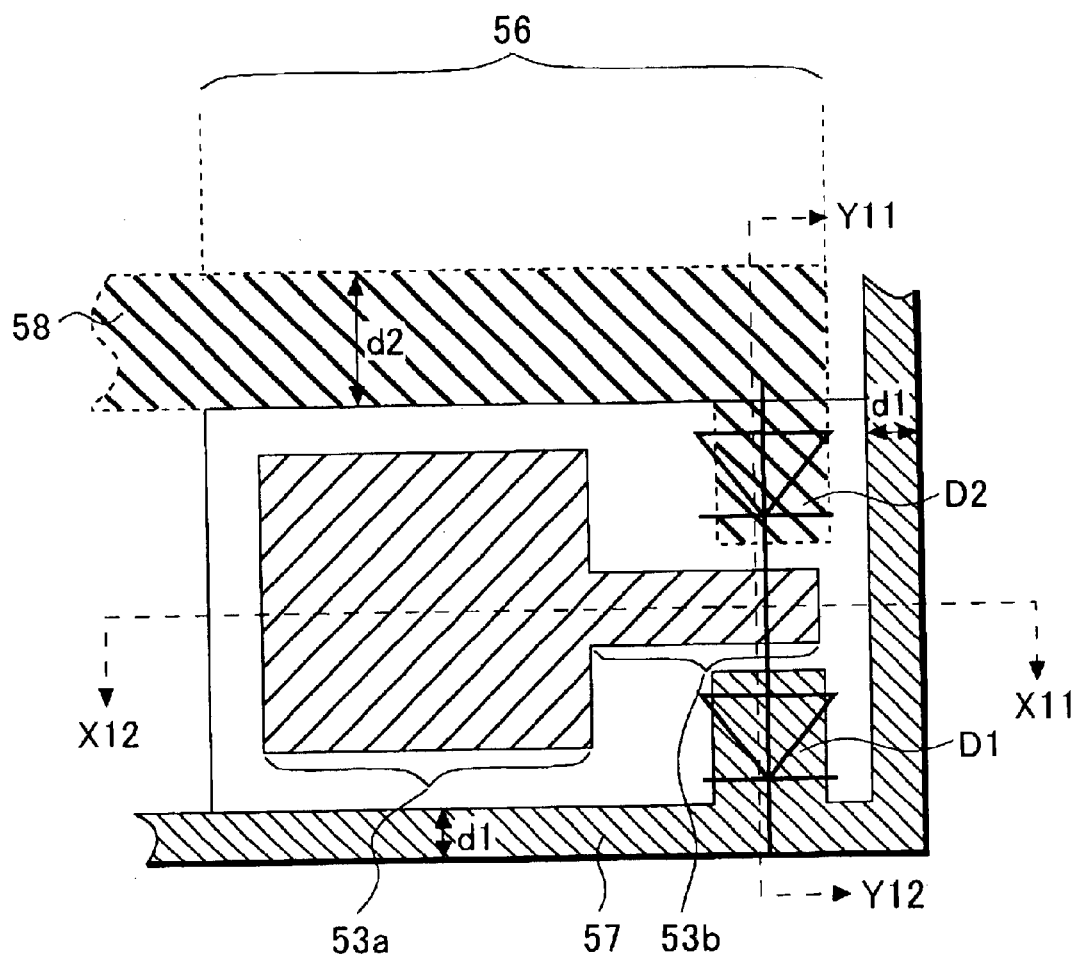
FIG. 8 is an expanded plan view of a cell of the device of FIG. 6.

FIG. 8 is an enlarged plan view of the cell 56. The top layer metal 57 extends along the outer sides of the cells 56 and along the periphery of the LSI 50, and extends to the surface of the diode D1 in the protection circuit 55.

The bottom layer metal 58 is formed along the inner sides of the cells 56 keeping the width d2. The bottom layer metal 58 is formed under the interlayer insulation film 59 and on an oxide film 73, which will be described later.

In this embodiment, the width dl of the top layer metal 57 is narrower than the width d2 of the bottom layer metal 58. However, the top layer metal 57 may be wider than the bottom layer metal 58, depending on a specific device design.

The cell 56 is an integrated element that includes the pad 53 and the protection circuit 55. The pad 53 consists of a larger rectangular bonding pad 53a and a smaller rectangular extension 53b formed continuously.

A bonding wire (not shown) is formed on the bonding pad 53a which is electrically connected with the circuit block 52 shown in FIG. 6. The extension 53b is formed as an extension to the bonding pad 53a, and directly connected with the protection circuit 55 formed underneath. The protection circuit 55 includes two diodes D1 and D2 connected in series.

Figure 9:
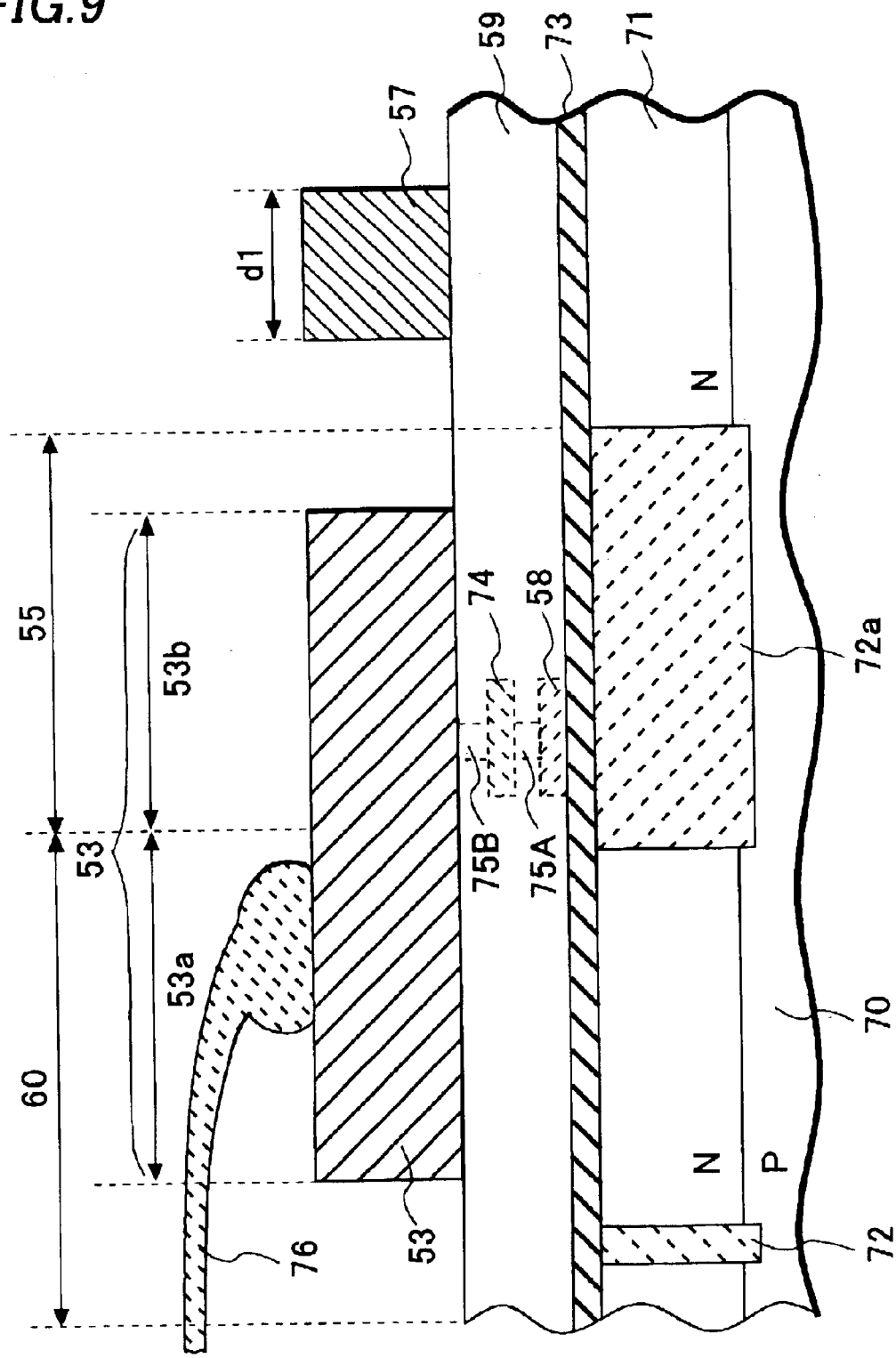
FIG. 9 is an expanded cross-sectional view of the cell of FIG. 6.
Figure 10:
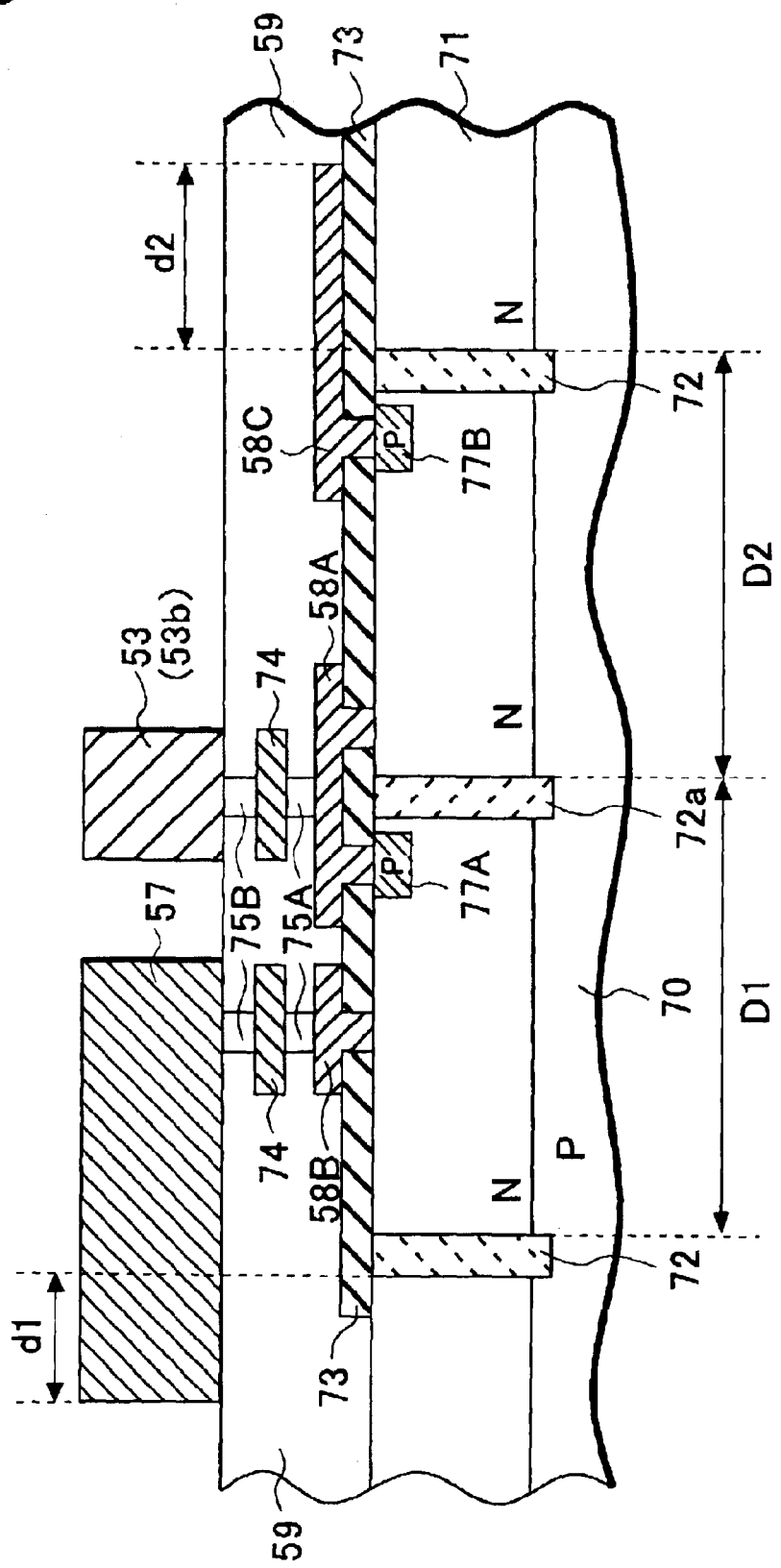
FIG. 10 is another expanded cross-sectional view of the cell of FIG. 6.
Figure 11:
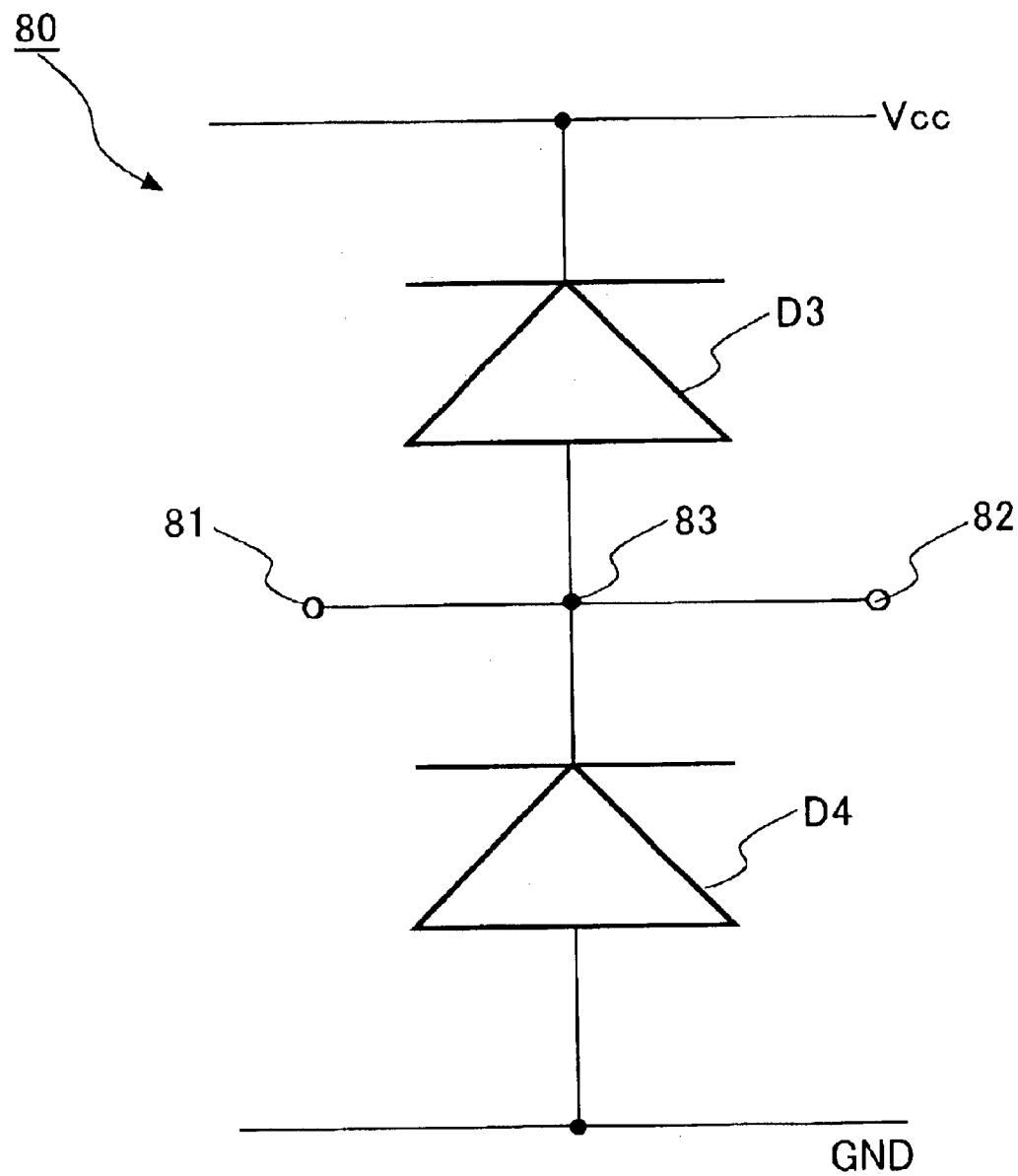
FIG. 11 is a circuit diagram showing a conventional protection circuit.
Figure 12:
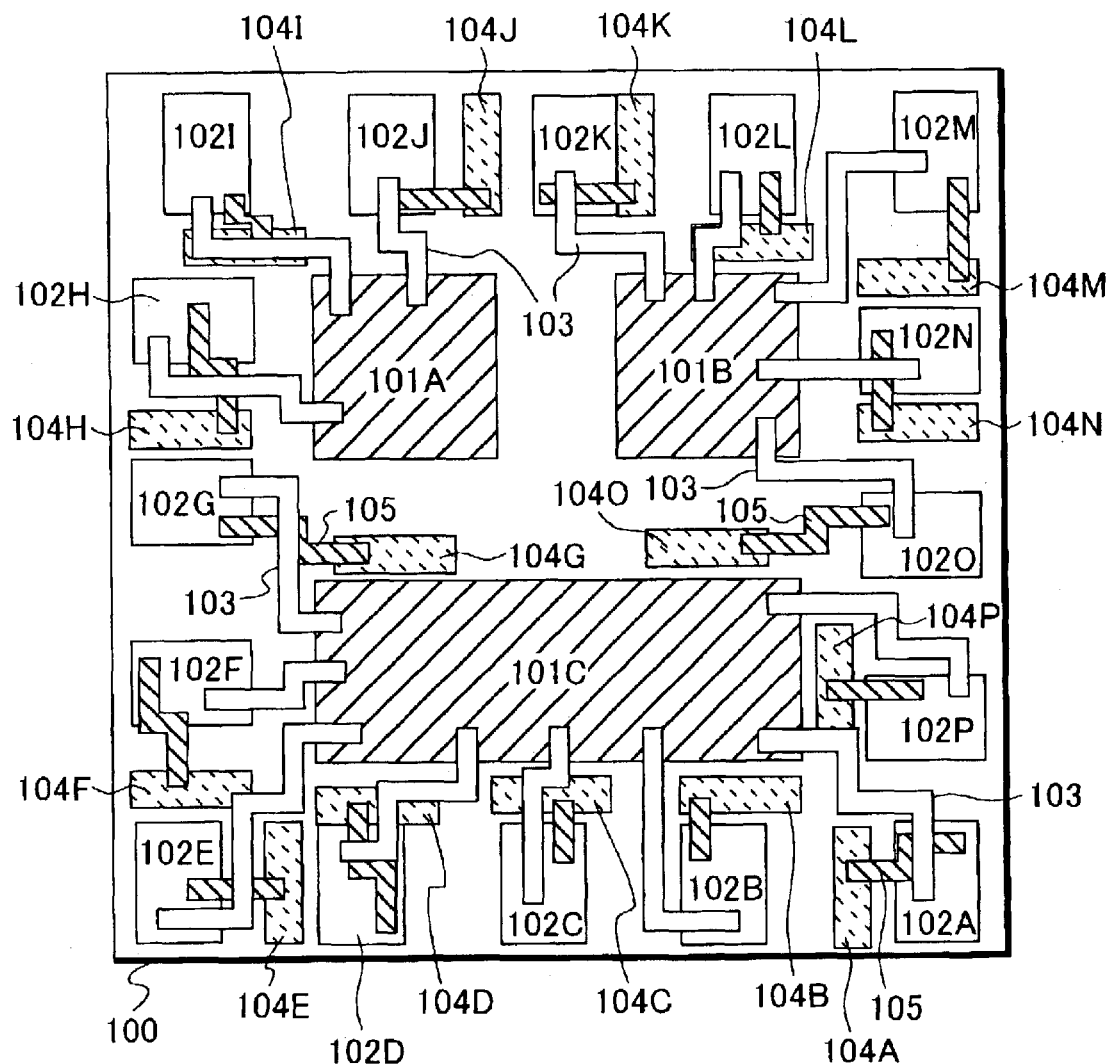
FIG. 12 is a plan view of a conventional semiconductor integrated circuit device.

The cross-sectional structure of the cell 56 is explained referring to FIG. 9 and FIG. 10 hereinafter. FIG. 9 is an expanded cross-sectional view of a section X11-X12 shown in FIG. 8, and FIG. 10 is an expanded cross-sectional view of a section Y11-Y12 shown in FIG. 8.

FIG. 9 is explained hereinafter. An N-type semiconductor layer 71 is formed on a P-type semiconductor substrate 70. The semiconductor layer 71 is electrically separated with isolation layers 72 and 72a. The isolation layer 72a separates the two diodes D1 and D2 in the protection circuit 55. That is, the diode D1 is located in front of the isolation layer 72a while the diode D2 is located behind the isolation layer 72a. An oxide film 73 is a silicon dioxide film formed on the surface of the semiconductor layer 71 by thermal oxidation.

An interlayer insulation film 59 is formed on the oxide film 73. A plurality of metal layers (for example, a bottom layer metal 58 and an intermediate layer metal 74 in the figure) and a plurality of contact holes, for example 75A and 75B, electrically connecting the metal layers are formed in the interlayer insulation film 59.

Next, each of the metal layers and others in the interlayer insulation film 59 is explained. The bottom layer metal 58 is formed at a desired position on the surface of the oxide film 73 and makes contact with the connection node between the diodes D1 and D2 in the protection circuit 55. The bottom layer metal 58 is connected with the pad 53 through the contact hole 75A, the intermediate layer metal 74 and the contact hole 75B. There are two metal layers (the bottom layer metal 58 and the intermediate layer metal 74) in the example disclosed, though the number of the metal layers may change.

The pad 53 is formed on a desired position on the surface of the interlayer insulation film 59. A bonding wire 76 is formed on the bonding pad 53a. A region underneath the bonding pad 53a can be used to accommodate a structure such as a deep trench.

The top layer metal 57 has the width d1 on the interlayer insulation film 59 outside of the protection circuits 55.

The top layer metal 57 and the pad 53 can be formed in the same sputtering process. In this case, the pad 53 has the same film thickness as the top layer metal 57. Or the top layer metal 57 and the pad 53 can be formed in separate processes and can have different film thickness.

FIG. 10 is explained hereinafter. The semiconductor layer 71 formed on the semiconductor substrate 70 is electrically divided with a plurality of isolation layers 72 and 72a. The isolation layer 72a separates the diode D1 and the diode D2. The oxide film 73 covers the surface of the semiconductor layer 21.

The diodes D1 and D2 have P-type layers 77A and 77B formed by diffusion from the surface of the semiconductor layer 71. The P-type layer 77A makes an anode of the diode D1 and the P-type layer makes an anode of the diode D2.

The bottom layer metals 58A, 58B and 58C are formed on the oxide film 73 by patterning the bottom layer metal 58, and make contact with the N-type semiconductor layer 71 and the P-type layers 77A and 77B.

The bottom layer metal 58A connects the P-type layer 77A of the diode D1 and the N-type layer of the diode D2. The bottom layer metal 58A is connected through the contact hole 75A to the intermediate layer metal 74 which is connected to the extension 53b through another contact hole 75B.

The bottom layer metal 58B makes contact with the N-type layer of the diode D1 and connected with the top layer metal 57 through the contact hole 75A, intermediate layer metal 74 and the contact hole 75B. The portion of the top layer metal 57, which extends outside the diode D1 (left side in the figure), corresponds to the width d1 shown in FIG. 8.

The bottom layer metal 58C makes contact with the P-type layer 77B of the diode D2. The portion of the bottom layer metal 58C, which extends outside the diode D2 (right side in the figure), corresponds to the width d2 shown in FIG. 8. The bottom layer metal 58B is provided with the power supply voltage Vcc through the top layer metal 57, and the bottom layer metal 58C is provided with the ground voltage GND. The GND wiring and the Vcc wiring, which provide the diodes D1 and D2 with the ground voltage GND and the power supply voltage Vcc, are connected to each of the circuit blocks 52.

As described above, the semiconductor integrated circuit shown in FIG. 6 and FIG. 7 are formed by disposing the cells 56 based on a predetermined pattern.

When the top layer metal 57 and the pad 53 are formed in separate process steps, they may have different film thickness. For example, when especially low impedance of the Vcc wiring is preferred, the thickness of the top layer metal 57 may be made extremely thick (twice of that of the pad 53, for example).

Or, when especially a low impedance of the GND wiring is preferred, the width d2 of the bottom layer metal 58C is made as wide as possible.

As described above, the second embodiment of this invention has following effects, in addition to the effects of the first embodiment mentioned above.

The impedance of the Vcc wiring can be reduced by forming the top layer metal 57 extending along the outer sides of the cells 56 and increasing the width of the top layer metal 57. The impedance of the top layer metal 57 can be further reduced by forming the thickness of the top layer metal 57 as thick as the design allows.

Also, the impedance of the bottom layer metal 58 can be further reduced by forming the bottom layer metal 58 extending along the inner sides of the plurality of cells 56 and increasing the width of the bottom layer metal 58 as much as the design allows.

Synergistic effect can be obtained by selecting and combining the design guide lines described above.

In the first and second embodiments, the cells 6, 56 are placed in a predetermined pattern. That is, each of the diodes D2 connected to the bottom layer metal 26 or 58 is disposed inner side of the LSI, and each of the diodes D1 connected to the intermediate layer metal 27 or 74 is disposed outer side of the LSI. Furthermore, the cells 6 or 56 are disposed at regular intervals.

Although the power supply voltage Vcc is connected to the top layer metal 57 disposed outside of the cells 56, and the ground voltage GNI is connected to the bottom layer metal 57 disposed inner side of the cells 56 in the embodiments, it is also possible that the power supply voltage Vcc is connected to the bottom layer metal 58 and the ground voltage GND is connected to the top layer metal 57. In this configuration, the orientation of each of the diodes in the protection circuits is reversed.

Although the protection circuits 5 and 55 includes diodes in the first and second embodiments, the protection circuit may include elements such as MOS transistors, bipolar transistors, PIN diodes and clamp circuits.

With the semiconductor integrated circuit of this invention, crossing of interconnections and adverse effects on circuit characteristics is prevented by integrating the pad and the protection circuit into the cell and disposing the cells along the peripheries of the circuit blocks. Also the impedance of the power supply wiring and the ground wiring are reduced in these embodiments.

What is claimed is:

1. A semiconductor integrated circuit device comprising:
   a circuit block;
   a pad electrically connected to the circuit block; and
   a protection circuit integrated with the pad as an integrated device element, an internal electrical connection being provided within the integrated device element between the pad and the protection circuit.

2. The semiconductor integrated circuit device of claim 1, further comprising one or more of the pads and one or more of the protection circuits, each of the pads and corresponding one of the protection circuits forming the integrated device element including the internal electrical connection, wherein the integrated device elements are aligned along an edge of the circuit block.

3. The semiconductor integrated circuit device of claim 2, further comprising a first metal wiring providing the protection circuits with a first electric potential and a second metal wiring providing the protection circuits with a second electric potential different from the first electric potential, wherein the first metal wiring is disposed at a side of the aligned integrated device elements opposite from the circuit block and the second wiring is disposed between the circuit block and the aligned integrated device elements.

4. The semiconductor integrated circuit device of claim 3, wherein the first metal wiring and the second metal wiring are disposed at different layers of the semiconductor integrated circuit device.

5. The semiconductor integrated circuit device of claim 2, wherein each of the protection circuits comprises a first diode and a second diode connected in series.

6. The semiconductor integrated circuit device of claim 5, further comprising a power supply wiring providing a cathode of the first diode with a power supply voltage and a ground wiring providing an anode of the second diode with a ground voltage, wherein the power supply wiring is disposed at a side of the aligned integrated device elements opposite from the circuit block and the ground wiring is disposed between the circuit block and the aligned integrated device elements.

7. The semiconductor integrated circuit device of claim 6, wherein the power supply wiring is disposed in a first layer of the semiconductor integrated circuit device and the ground wiring is disposed in a second layer of the semiconductor integrated circuit device, the first layer being disposed above the second layer.

* * * * *